United States Patent
Honma et al.

(10) Patent No.: US 7,466,023 B2
(45) Date of Patent: Dec. 16, 2008

(54) SEMICONDUCTOR LIGHT EMITTING DEVICE AND PLANT CULTIVATING SYSTEM

(75) Inventors: Takayoshi Honma, Hamamatsu (JP); Hiroshi Tsuchiya, Hamamatsu (JP); Hirofumi Kan, Hamamatsu (JP)

(73) Assignee: Hamamatsu Photonics K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 10/506,508

(22) PCT Filed: Mar. 6, 2003

(86) PCT No.: PCT/JP03/02668
§ 371 (c)(1),
(2), (4) Date: Sep. 3, 2004

(87) PCT Pub. No.: WO02/47224
PCT Pub. Date: Jun. 13, 2002

(65) Prior Publication Data
US 2005/0151140 A1 Jul. 14, 2005

(30) Foreign Application Priority Data
Mar. 6, 2002 (JP) ............................. 2002-060854

(51) Int. Cl.
*H01L 23/34* (2006.01)
(52) U.S. Cl. .................. 257/714; 257/E23.098; 361/698; 29/848
(58) Field of Classification Search ........... 257/714, 257/E29.098; 29/848; 361/698
See application file for complete search history.

(56) References Cited

U.S. PATENT DOCUMENTS

| 4,051,509 A | | 9/1977 | Beriger et al. ............... 357/82 |
| 5,105,429 A | * | 4/1992 | Mundinger et al. ........... 372/34 |
| 5,764,675 A | * | 6/1998 | Juhala ...................... 372/50.1 |
| 5,870,823 A | * | 2/1999 | Bezama et al. ............... 29/848 |

(Continued)

FOREIGN PATENT DOCUMENTS

EP    0 973 237 A1    1/2000

(Continued)

OTHER PUBLICATIONS

O plus E, vol. 21, No. 2, pp. 173-178, Feb. 1999 (w/English Abstract).

*Primary Examiner*—Howard Weiss
*Assistant Examiner*—John C Ingham
(74) *Attorney, Agent, or Firm*—Drinker, Biddle & Reath LLP

(57) ABSTRACT

Guard electrodes 2 which are electrically connected with a conductive portion of a cooling water passage 23 through connection lines 3 are respectively provided in the middle of a water inlet pipe 1 connected with a water inlet master pipe 10 and a water outlet pipe 6 connected with a water outlet master pipe 13 in M pieces of semiconductor laser units 4. At this time, since the guard electrode 2 has a potential equal to the conductive portion of the cooling water passage 23, the electric current hardly flows between the guard electrode 2 and the conductive portion of the cooling water passage 23. As a result, rusting is inhibited in the M pieces of semiconductor laser units 4, and a clogged piping is prevented in the cooling water passage 23.

5 Claims, 8 Drawing Sheets

U.S. PATENT DOCUMENTS

| | | | | |
|---|---|---|---|---|
| 6,397,932 | B1 * | 6/2002 | Calaman et al. | 165/80.4 |
| 6,473,303 | B2 * | 10/2002 | Kaufmann | 361/699 |
| 6,898,222 | B2 * | 5/2005 | Hennig et al. | 372/36 |

FOREIGN PATENT DOCUMENTS

| | | |
|---|---|---|
| JP | 55-43392 | 3/1980 |
| JP | 57-2667 | 1/1982 |
| JP | 08-139479 | 5/1996 |
| JP | 09-098665 | 4/1997 |
| JP | 10-335727 | 12/1998 |
| JP | 11-196671 | 7/1999 |
| JP | 2000-031546 | 1/2000 |
| JP | 2001-044517 | 2/2001 |
| JP | 2001-054320 | 2/2001 |
| JP | 2001-060736 | 3/2001 |
| JP | 2001-284659 | 10/2001 |
| JP | 2002-026434 | 1/2002 |

* cited by examiner

SEMICONDUCTOR LIGHT EMITTING DEVICE AND PLANT CULTIVATING SYSTEM

FIELD OF THE ART

The present invention relates to a semiconductor light emitting device using a semiconductor light emitting element such as a semiconductor laser, for example, relates to a semiconductor light emitting device used for micro fabrication process and plant cultivation or the like.

BACKGROUND ART

In a semiconductor laser array in which a plurality of semiconductor laser elements as one of semiconductor light emitting elements are arranged, a laser output is generally saturated due to a temperature increase. Therefore, a heat sink which cools the semiconductor laser array is used with the semiconductor laser array. For instance, these techniques are disclosed in "O plus E 1999-2 Vol. 21 No. 2(p. 173-178)" and Japanese Patent Application Laid-Open No. H8-139479. According to the techniques, the semiconductor laser array is cooled by cooling water passing through a cooling water passage provided in the heat sink, and thereby the laser output is prevented from being saturated.

DISCLOSURE OF THE INVENTION

Particularly, the present inventors have performed an application study of a semiconductor light emitting device containing a plurality of light emitting units to a plant cultivation apparatus, and as a result of the study on the application of the techniques disclosed in the above documents regarding the semiconductor light emitting device, the following findings were obtained.

That is, an electric current may flow through the cooling water when the electric current is carried to the semiconductor laser array, and the electric current electrolytes the cooling water to generate oxygen. The oxygen generated rusts the cooling water passage of the heat sink. An increase in the amount of rust causes a clogged piping in the cooling water passage. In other words, when the electric current flows through the cooling water, a clogged piping may be generated in the cooling water passage.

The present invention has been accomplished in view of the foregoing. It is an object of the present invention to provide a semiconductor light emitting device which can prevent a clogged piping in the cooling water passage by inhibiting rusting in the cooling water passage, and a plant cultivation apparatus by using the same.

A semiconductor light emitting device according to the present invention comprises: M pieces of light emitting units (M is an integer of 2 or more) in which a light emitting element array composed by arranging a plurality of semiconductor light emitting elements is mounted in a heat sink having a cooling water passage of which at least a part has conductivity; power supply means for electrically and serially connecting the M pieces of light emitting element arrays contained in the M pieces of light emitting units, and which supplies the electric power for making the semiconductor light emitting element emit light; and cooling water supply means for connecting the cooling water passages of the M pieces of heat sinks contained in the M pieces of light emitting units in parallel by water conveyance pipes, and which supplies cooling water which cools the semiconductor light emitting element, wherein, in each of the M pieces of light emitting units, a conductive member connected electrically with the conductive portion of the cooling water passage is provided separately in the upstream direction or the downstream direction of the water conveyance pipe by a predetermined distance from the water inlet end or the water outlet end of the cooling water passage, and comes into contact with cooling water.

Since the conductive member provided separately in the upstream direction or in the downstream direction of the water conveyance piping has an equal potential to the conductive portion of the cooling water passage according to the above semiconductor light emitting device, the electric current hardly flows between the conductive member and the conductive portion of the cooling water passage, and rusting in the M pieces of light emitting units is inhibited. Thereby a clogged piping of the cooling water passage is prevented.

In the plant cultivation apparatus according to the present invention, the semiconductor light emitting device irradiates plants with light to cultivate the plants. According to the plant cultivation apparatus, the light necessary for cultivating the plants can be stably irradiated for a long period of time.

BEST MODE FOR CARRYING OUT THE INVENTION

Figure 1:
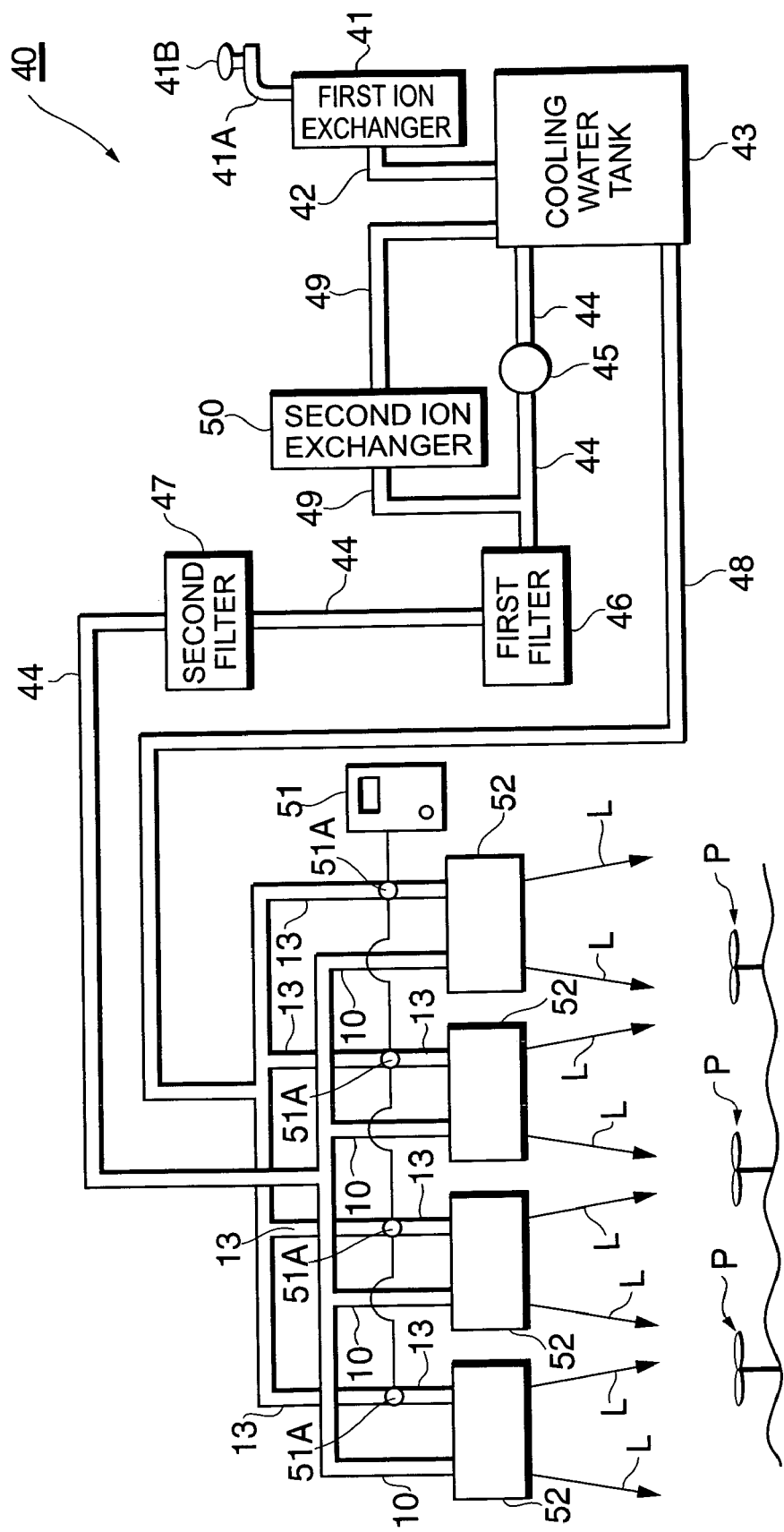
FIG. 1 is a block diagram showing an embodiment of a plant cultivation apparatus.

Hereinafter, the embodiment of the present invention will be described in detail with reference to the accompanying drawings. In the description of the drawings, identical components or corresponding elements are designated by the same reference numerals, and overlapping description is omitted.

FIG. 1 is a block diagram showing an embodiment of a plant cultivation apparatus according to the present invention. The plant cultivation apparatus 40 irradiates plants P with a light L from a semiconductor light emitting element (semiconductor laser) to cultivate the plants P. As shown in FIG. 1, a first ion exchanger 41 is connected with a water pipe 41A, and chlorine ions or the like are removed from tap water supplied by operating a faucet 41B. Then, the water is supplied to a cooling water tank 43 through a cooling water supply pipe 42. For instance, the cooling water tank 43 can store cooling water of 2 t (ton) or less. A water inlet pipe 44 for the passage of the cooling water supplied to cooling objects (four light emitting panels 52 described below) and a water outlet pipe 48 for the passage of the cooling water coming out of the cooling objects and returning to the cooling water tank 43 are connected in parallel with the cooling water tank 43.

A pump 45, a first filter 46 and a second filter 47 are provided in this order toward the light emitting panel 52 side from the cooling water tank 43 in the water inlet pipe 44. The pump 45 is a flow source for circulating the cooling water stored in the cooling water tank 43 through the water inlet pipe 44 and the water outlet pipe 48 in the plant cultivation apparatus 40. The first filter 46 has minute holes of 300 µm, and the second filter 47 has minute holes of 60 µm. The first filter 46 and the second filter 47 remove garbage or the like mixed in the cooling water.

A bypass pipe 49 is connected between the cooling water tank 43 and the water inlet pipe 44 so as to bypass the pump 45. The bypass pipe 49 branches a part of the cooling water pressure-fed toward the direction of the first filter 46 from the pump 45, and has functions for returning the part of the cooling water to the cooling water tank 43 through a second ion exchanger 50. The second ion exchanger 50 restrains the conductivity of the cooling water circulated by the pump 45, and the maximum flow quantity in which ions are exchangeable is limited. Therefore, the second ion exchanger 50 is provided not in the water inlet pipe 44 but in the bypass pipe 49 branched from the water inlet pipe 44 so as to prevent the cooling water of the maximum flow quantity or more from flowing into the second ion exchanger 50.

The water inlet pipe 44 is branched into four water inlet master pipes 10 at the end on the downstream side, and the water outlet pipe 48 is branched into four water outlet master pipes 13 at the end on the upstream side. Four light emitting panels 52 are interposed between four sets of the master pipes 10 and 13 of the water inlet side and the water outlet side. Sensors 51A are respectively provided in the water outlet master pipes 13, and are connected with a conductivity meter 51.

Figure 2:
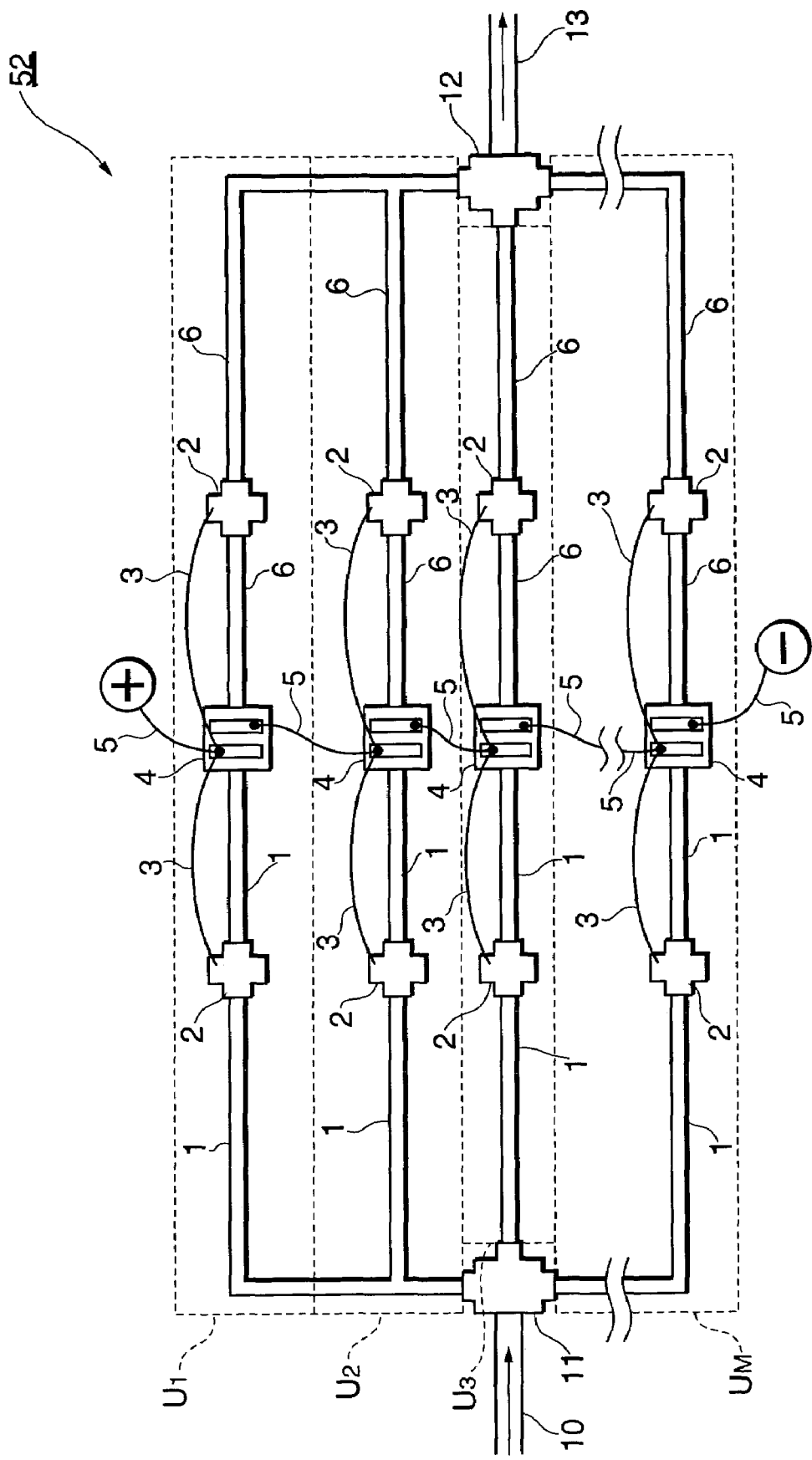
FIG. 2 is a block diagram of a light emitting panel shown in FIG. 1.

FIG. 2 is a block diagram of the light emitting panel 52 in the plant cultivation apparatus 40 shown in FIG. 1. A water inlet manifold 11 connected with the water inlet master pipe 10 is connected with a water outlet manifold 12 through M pieces of units $U_1$-$U_M$ provided mutually in parallel, and the cooling water flows into the water outlet manifold 12 through the units $U_1$-$U_M$. The water outlet manifold 12 is connected with the water outlet master pipe 13, and the cooling water introduced flows into the water outlet master pipe 13.

Since the units $U_1$-$U_M$ have the same structure, the unit $U_1$ will be typically described. In the unit $U_1$, a water inlet pipe (water conveyance pipe) 1, a semiconductor laser unit (light emitting unit) 4, and a water outlet pipe (water conveyance pipe) 6 are connected in this order from the upstream side, and the cooling water flows in this order. Guard electrodes (conductive member) 2 made of a conductive member are respectively interposed in the middle of the water inlet pipe 1 and the water outlet pipe 6. The guard electrode 2 is electrically connected with the conductive portion (the conductive portion of a cooling water passage 23 described below) of the semiconductor laser unit 4 through a connection line 3, and thereby the guard electrode 2 has an equal potential to the conductive portion.

The semiconductor laser units 4 of the M pieces of units $U_1$-$U_M$ are serially connected by connection lines 5 for current supply, and direct current or pulse current for light emitting drive is applied. Therefore, the connection lines 5 for current supply and a power source body (not shown) or the like function as power supply means for connecting M pieces of light emitting parts in series to supply an electric current. The semiconductor laser units 4 are connected in parallel by the water inlet pipes 1 and the water outlet pipes 6, and cooling water for cooling a light emitting part (a semiconductor laser array 20 described later) is supplied. Therefore, the pipes 1, 6, 10, 11, 12, 13, 44 and 48 or the like function as cooling water supply means for supplying the cooling water which cools M pieces of the light emitting parts connected through the pipelines in parallel.

Figure 3:
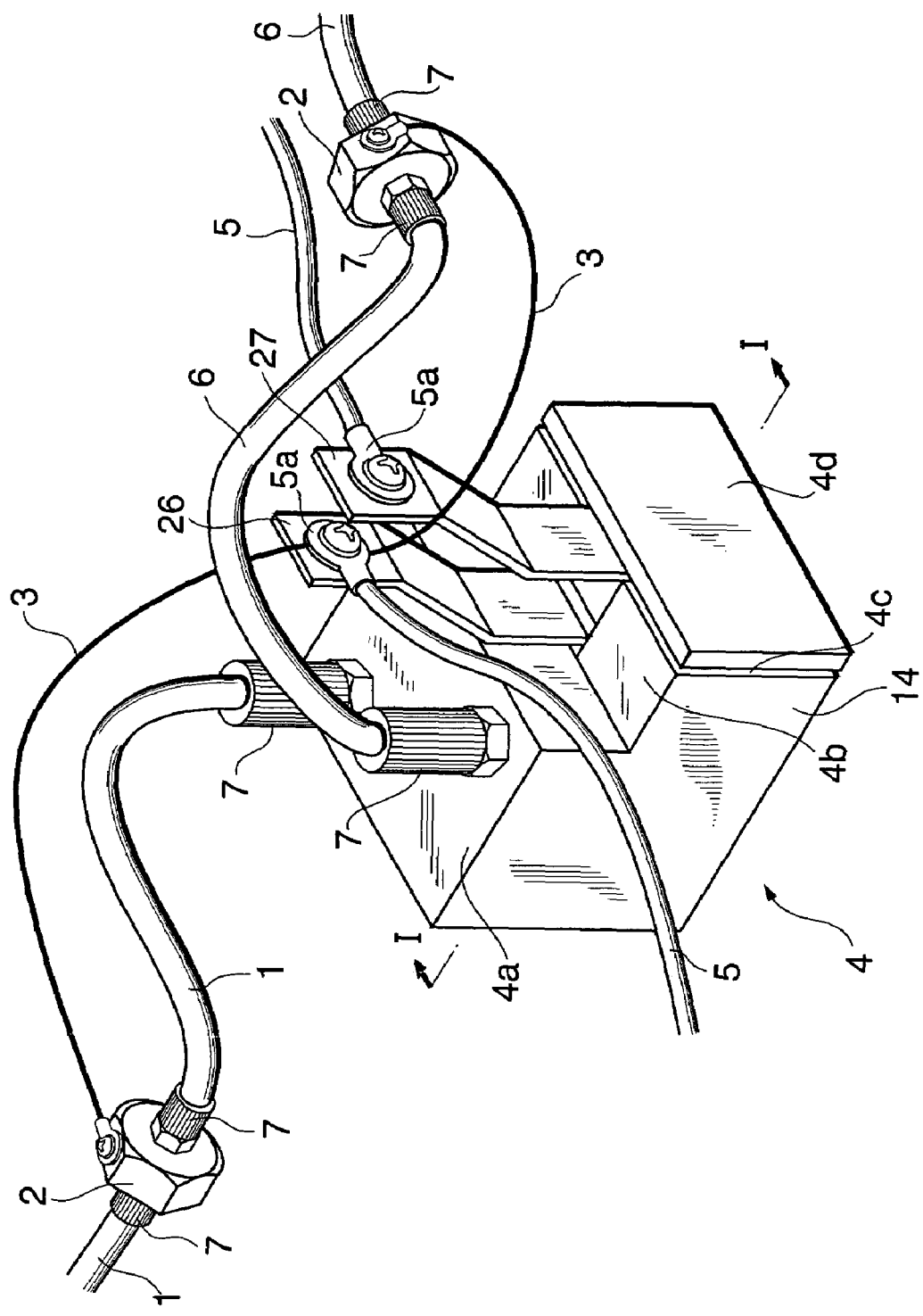
FIG. 3 is a perspective view of a single unit shown in FIG. 2.

FIG. 3 is a perspective view of a single unit U shown in FIG. 2. The semiconductor laser unit 4 has a stair shaped box 14, and the box 14 has upper surfaces 4a and 4b of different heights. A cover part 4d is attached to a front face 4c which shares a side with the upper surface 4b of a lower part and is a square face, and electrodes 26 and 27 extend upward from the upper surface 4b of the lower part. The electrodes 26 and 27 are conducting parts for supplying the current to the light emitting part that the semiconductor laser unit 4 has. A screw or the like is inserted into an attaching part 5a at the tip of the connection line 5 for current supply, and thereby the connection lines 5 for current supply are respectively fixed to the electrodes 26 and 27.

Two connection lines 3 are sandwiched and fixed between an attaching part 5a and the electrode 26. The other end sides of the connection lines 3 are respectively fixed by screws to the surfaces of the guard electrodes 2 interposed in the middle of the water inlet pipe 1 and the water outlet pipe 6 connected with the upper surface 4a of a higher part. The guard electrode 2 is an octagonal cylindrical body. The inside of the cylindrical body leads to the water inlet pipe 1 and the water outlet pipe 6, and the guard electrode 2 has functions for making the cooling water flow. In addition, the elements 1, 2, 4 and 6 are connected such that the cooling water is prevented from leaking through a cylindrical connection part 7.

Figure 4:
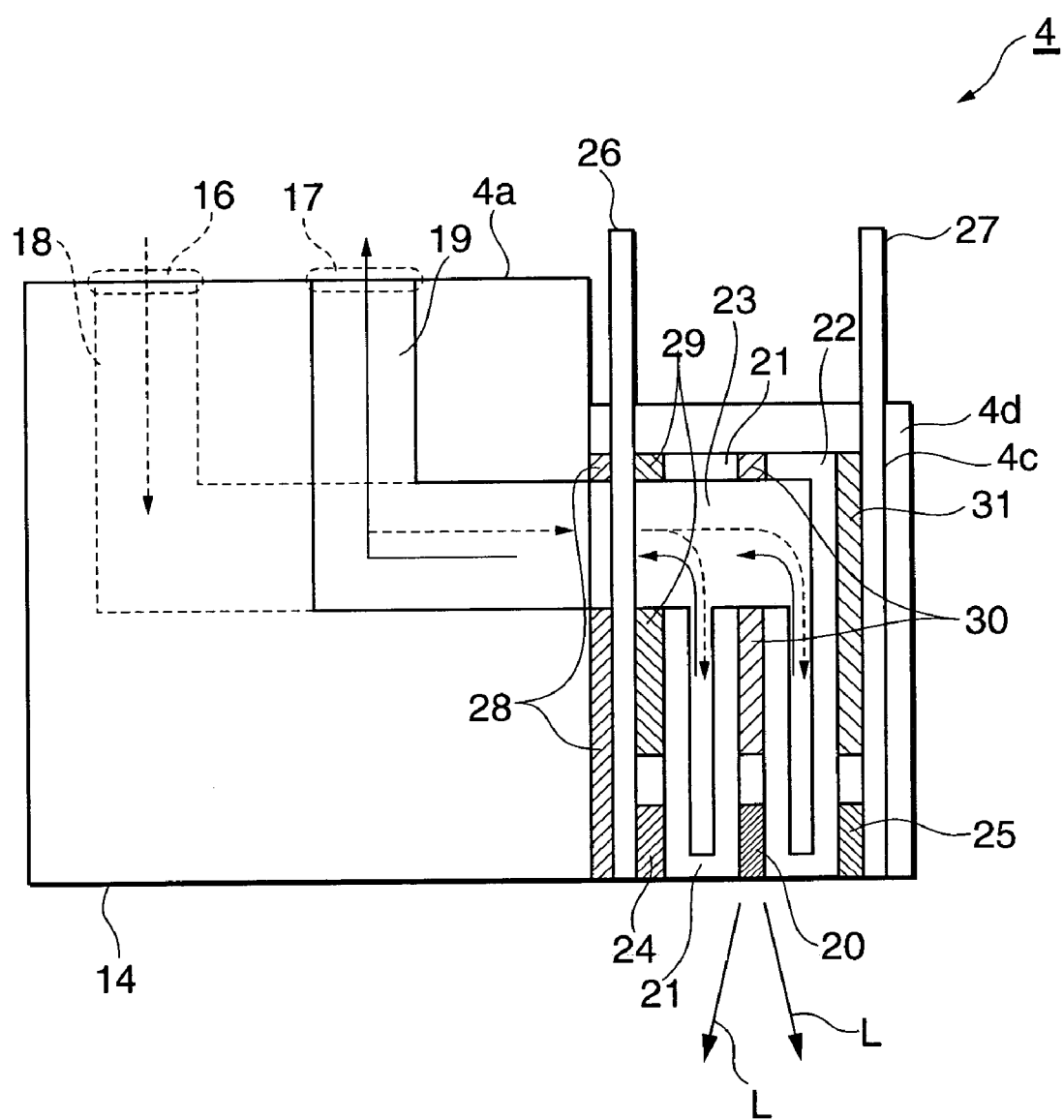
FIG. 4 is a cross sectional view of a semiconductor laser unit of FIG. 3 taken along line I-I.

FIG. 4 is a cross sectional view of a semiconductor laser unit 4 of FIG. 3 taken along line I-I. Various elements are stored in the box 14 of the semiconductor laser unit 4. A water inlet hole 16 and a water outlet hole 17 are formed on the upper surface 4a of the box 14. The water inlet pipe 1 is connected with the water inlet hole 16, and the water inlet hole 16 introduces the cooling water. The water outlet pipe 6 is connected with the water outlet hole 17, and the water outlet hole 17 makes the cooling water flow out.

The water inlet hole 16 is connected with a water inlet passage 18, and the water inlet passage 18 makes the cooling water introduced into the semiconductor laser unit 4 flow in a cooling water passage 23 provided in heat sinks 21 and 22. The water outlet hole 17 is connected with the water outlet passage 19, and the water outlet passage 19 makes the cooling water introduced from the cooling water passage 23 flow to the outside of the semiconductor laser unit 4. The semiconductor laser array 20 mounted between the heat sinks 21 and 22 is cooled by the cooling water which flows through the cooling water passage 23. At least a part of the cooling water passage 23 has conductivity, and the sectional area (the area of the cooling water passage 23) of the conductive portion is smaller than the sectional area (the sectional area of the inside of the pipe) of the guard electrode 2.

The semiconductor laser array 20 is composed by arranging a plurality of semiconductor laser elements. The electric current is supplied through the conductive portions of the heat sinks 21 and 22, and the semiconductor laser elements output the laser light L according to the current.

In addition, this electric current is flown through a first conductor 24 and a second conductor 25. The first conductor 24 is provided so as to come into contact with the heat sink 21 on the side of the heat sink 21 opposite to the semiconductor laser array 20, and comes into contact with the electrode 26 on the other side of the surface coming into contact with the heat sink 21. In the same way, the second conductor 25 is provided so as to come into contact with the heat sink 22 on the side of the heat sink 22 opposite to the semiconductor laser array 20, and comes into contact with the electrode 27 on the other side of the surface coming into contact with the heat sink 22.

The semiconductor laser unit 4 contains a first insulator 28 provided on the other side of the electrode 26 opposite to the electrode 27, a second insulator 29 provided at a position different from the first conductor 24 between the electrode 26 and the heat sink 21, a third insulator 30 provided at a position different from the semiconductor laser array 20 between the heat sinks 21 and 22, and a fourth insulator 31 provided at a position different from the second conductor 25 between the heat sink 22 and the electrode 27. The insulators 28-31 are made of rubber or the like. The respective insulators 28-31 interrupt the electric current which flows through the connection line 5 for current supply and the electrodes 26 and 27, and maintain the water tightness of the cooling water passage 23.

Figure 5:
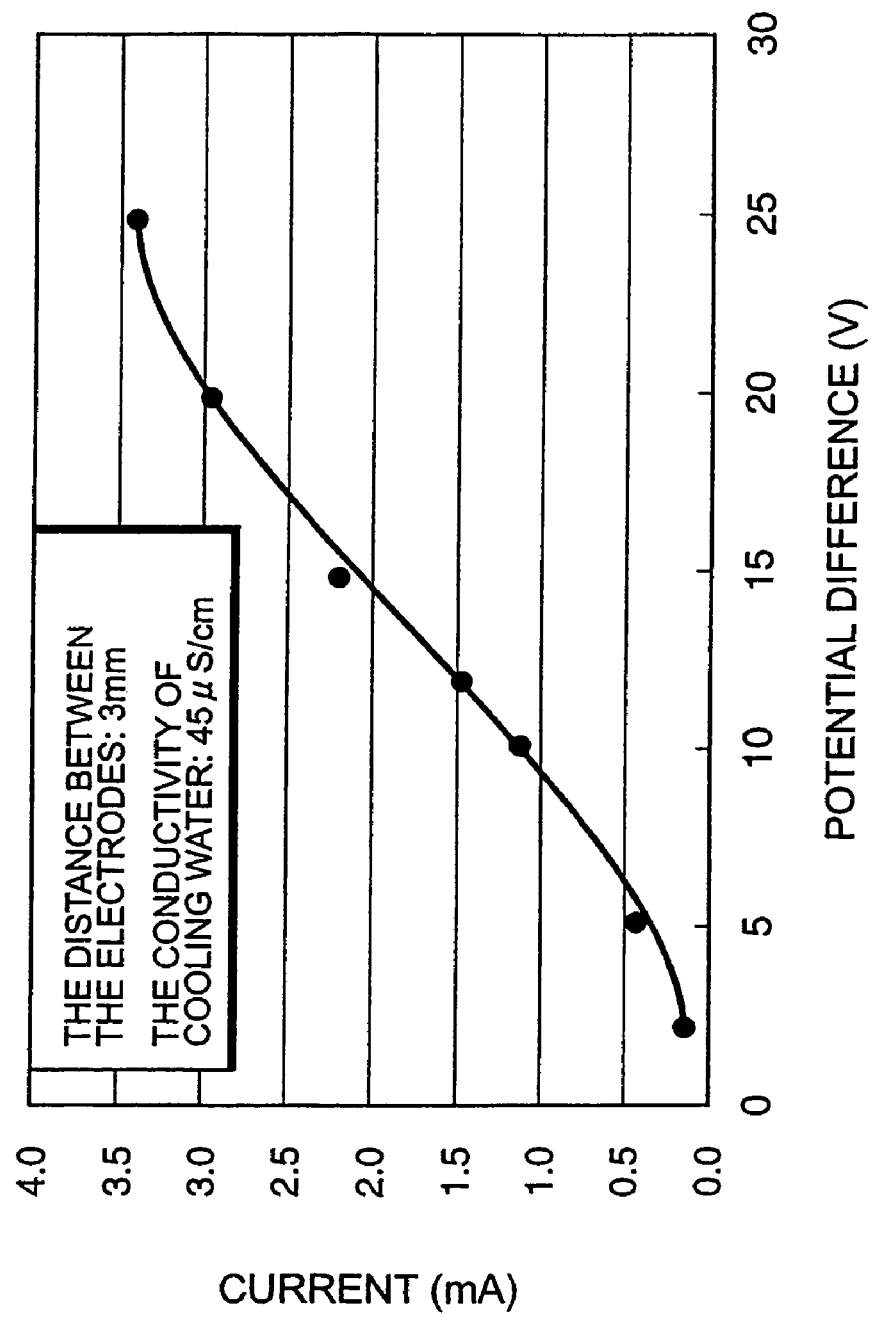
FIG. 5 shows current-potential characteristics when the conductivity of water is made constant.

The electric current may flow through the cooling water in the light emitting panel 52 having the semiconductor laser unit 4. One of the reasons is that a potential difference between the semiconductor laser arrays 20 of the respective semiconductor laser units 4 has a large value, and will be described in detail with reference to FIG. 5. FIG. 5 shows current-potential characteristics when the conductivity of water is made constant, and the current value is measured by changing the potential difference of two electrodes immersed in water. Herein, the distance between the electrodes is 3 mm, and the conductivity of the water is 45 µS/cm. As shown in FIG. 5, the larger the value of the potential difference is, the larger the current value that the current flowing between the electrodes is. Though the conductivity is made constant in the graph, the amount of the current that the current flowing between the electrodes has is larger when the conductivity increases.

Next, the precipitation of rust will be described in the plant cultivation apparatus 40 according to the embodiment. First, the cooling water is circulated in the plant cultivation apparatus 40 through the piping by activating the pump 45. The current is supplied to the semiconductor laser arrays 20 of the respective semiconductor laser units 4, and the laser light L is output.

Since M pieces of semiconductor laser arrays 20 are electrically connected in series in the light emitting panel 52, the potential difference is generated between the respective semiconductor laser arrays 20. The cooling water passages 23 are connected in parallel with the water inlet pipes 1 and the water outlet pipes 6. Therefore, when the potential difference between the respective semiconductor laser arrays 20 increases or the conductivity of the cooling water increases, the electric current flows through the cooling water.

On the other hand, the guard electrode 2 is electrically connected with the conductive portion of the cooling water passage 23 of the respective semiconductor laser unit 4, and comes into contact with the cooling water. Therefore, the current flowing through the cooling water flows without requiring the semiconductor laser unit 4 between the guard electrodes 2 of the units $U_1$-$U_M$. On the other hand, the current does not flow between two guard electrodes 2 which sandwich the semiconductor laser unit 4 since the conductive portion of the cooling water passage 23 of the respective semiconductor laser unit 4 is electrically connected with the guard electrodes 2, and the conductive portion has an equal potential to the guard electrodes 2.

Since the guard electrode 2 provided separately in the upstream direction of the water inlet pipe 1 or in the downstream direction of the water outlet pipe 6 has an equal potential to the conductive portion of the cooling water passage 23 according to the embodiment, the current hardly flows between the guard electrode 2 and the conductive portion of the cooling water passage 23, and rusting in the M pieces of semiconductor laser units 4 is inhibited. Thereby, the clogged piping of the cooling water passage 23 is prevented.

In addition, since the sectional area of the guard electrode 2 is larger than that of the conductive portion of the cooling water passage 23 according to the embodiment, a clogged piping of the guard electrode 2 is difficult to generated even if the rust is precipitated on the guard electrode 2. The light necessary for cultivating the plants can be stably irradiated for a long period of time according to the plant cultivation apparatus 40 using the semiconductor light emitting device having such a structure.

Figure 6:
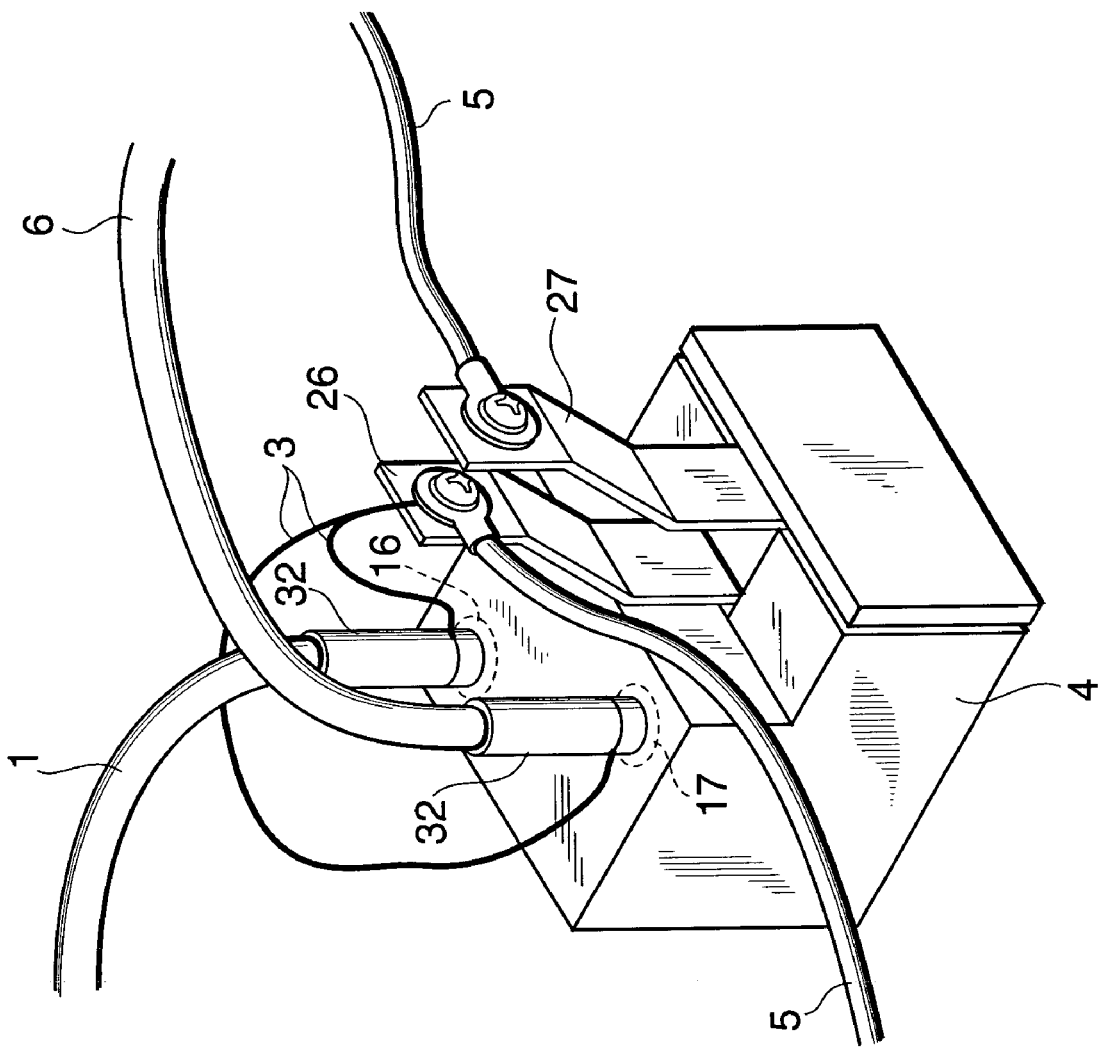
FIG. 6 is a perspective view showing a first modified structure which takes the place of a unit shown in FIG. 3.

Next, a first variation of the embodiment will be described with reference to FIG. 6. FIG. 6 is a perspective view showing a first modified structure which takes the place of a unit U shown in FIG. 3. Herein, connecting pipes (conductive member) 32 are used in place of the guard electrodes 2. Constructions other than the above structure are identical to those shown in FIG. 3.

The connecting pipe 32 is a cylindrical body formed by a conductive member. The connecting pipe 32 is provided separately by a predetermined distance in the upstream direction from a water inlet end of the cooling water passage 23, and comes into contact with the cooling water. Particularly, the connecting pipes 32 are provided between the water inlet hole 16 of the semiconductor laser unit 4 and the water inlet pipe 1, and between the water outlet hole 17 of the semiconductor laser unit 4 and the water outlet pipe 6.

In addition, the connection line 3 is wound around the surface of the connecting pipe 32, and the connecting pipe 32 is electrically connected with the conductive portion of the cooling water passage 23 in the same manner as the guard electrode 2. The relation of the sectional area is similar to that of the guard electrode 2.

As described above, rusting in M pieces of semiconductor laser units 4 is inhibited in the same manner as the case of using the guard electrode 2, and the clogged piping of the cooling water passage 23 is prevented according to the first variation.

Figure 7:
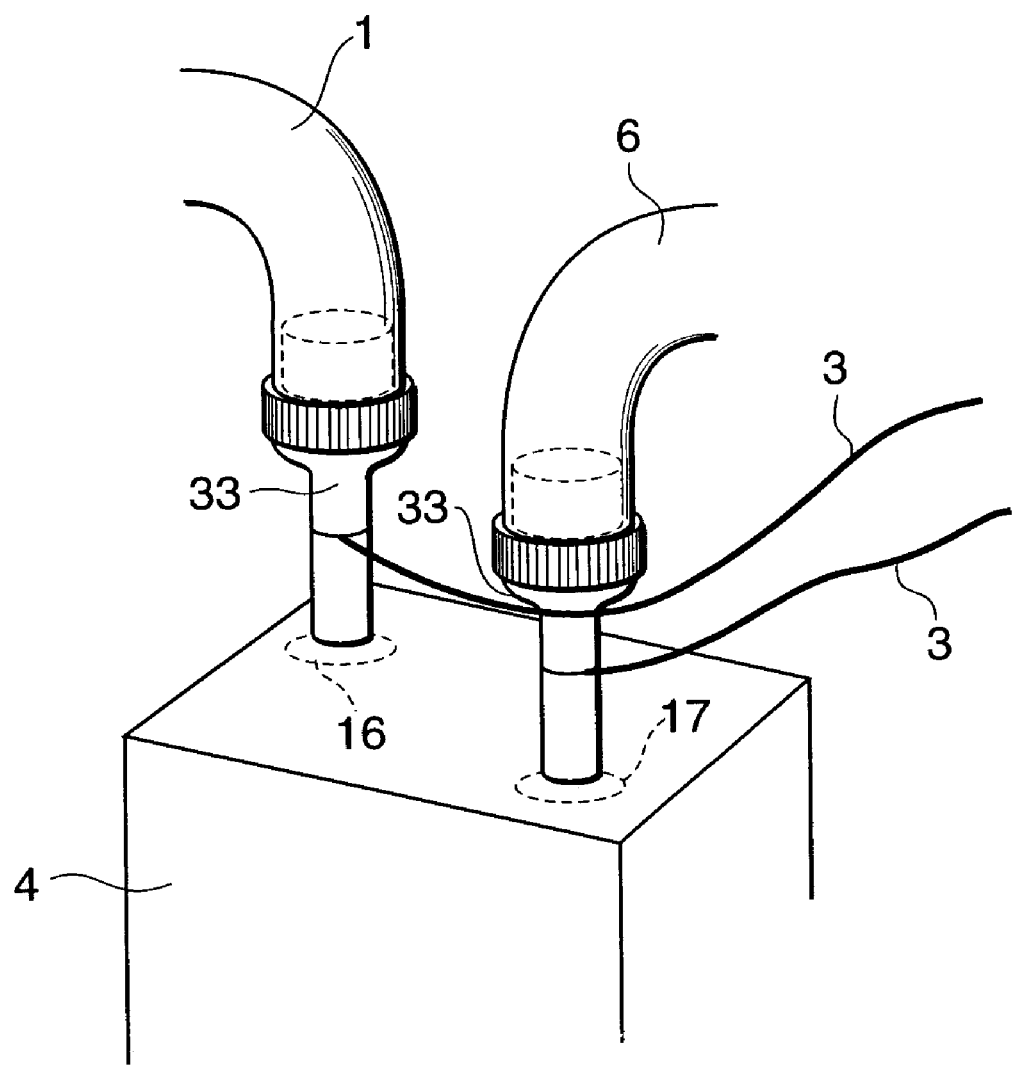
FIG. 7 is a perspective view showing a second modified structure which takes the place of a unit shown in FIG. 3.

Next, a second variation of the embodiment will be described with reference to FIG. 7. FIG. 7 is a perspective view showing a second modified structure which takes the place of a unit U shown in FIG. 3. In this variation, funnel-like connecting pipes 33 are provided, which are formed substantially like a funnel so as to extend its diameter toward an upstream direction of the water inlet pipe 1, and a downstream direction of the water outlet pipe 6, respectively. The funnel-like connecting pipes 33 are provided between the water inlet hole 16 of the semiconductor laser unit 4 and the water inlet pipe 1, and between the water outlet hole 17 of the semiconductor laser unit 4 and water outlet pipe 6.

In addition, the connection line 3 is wound around the surface of the funnel-like connecting pipe 33, and the funnel-like connecting pipe 33 is electrically connected with the conductive portion of the cooling water passage 23 in the same manner as the guard electrode 2. The sectional area of the part in which the diameter of the funnel-like connecting pipe 33 is contracted is larger than that of the cooling water passage 23. Constructions other than the above structure are identical to the structure of the unit U shown in FIG. 3.

Thus, according to the second variation, the funnel-like connecting pipe 33 extends its diameter toward the upstream direction of the water inlet pipe 1 or the downstream direction of the water outlet pipe 6. Thereby rust is precipitated on the part of which the diameter of the funnel-like connecting pipe 33 is extended, and the clogged piping of the funnel-like connecting pipe 33 is difficult to be generated.

Figure 8:
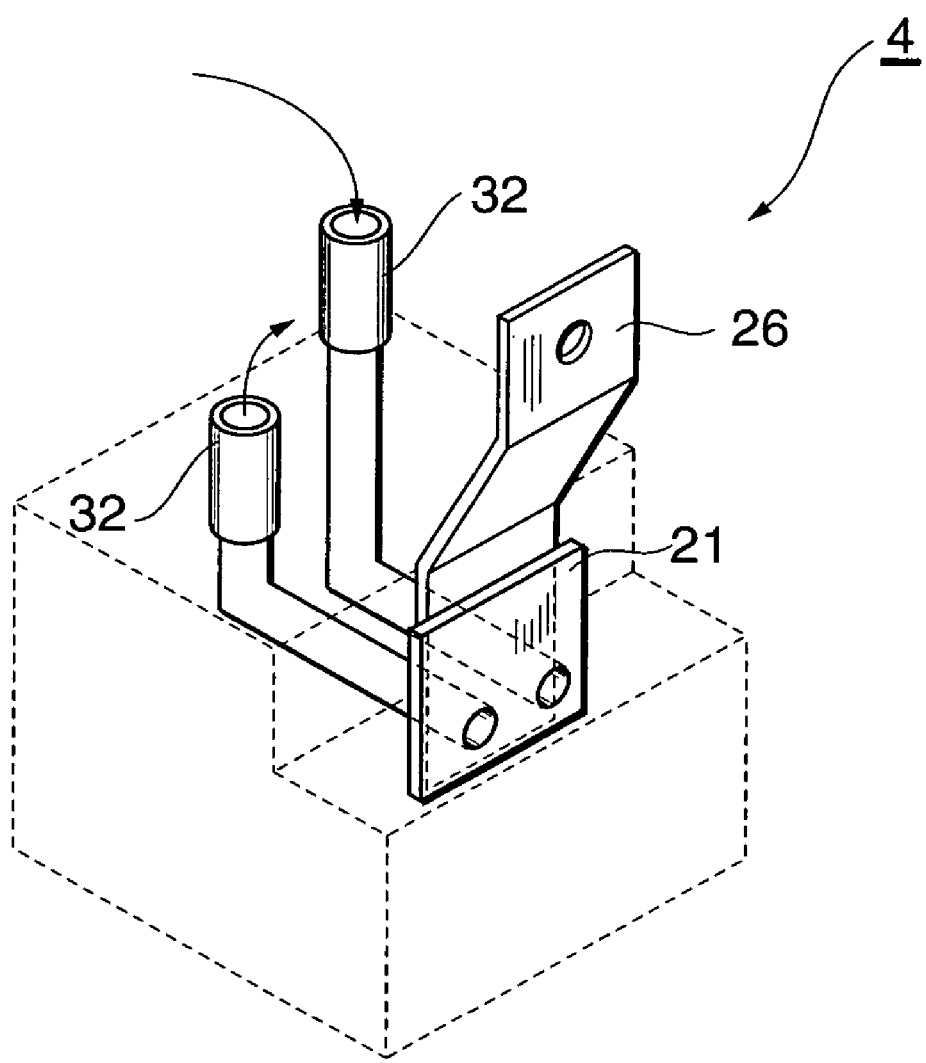
FIG. 8 is a perspective view showing a third modified structure which takes the place of a unit shown in FIG. 3.

Next, a third variation of the embodiment will be described with reference to FIG. 8. FIG. 8 is a perspective view showing a third modified structure which takes the place of a unit U shown in FIG. 3. In this variation, a connecting pipe 32 is used in place of the guard electrode 2. The connecting pipe 32 is attached to the water inlet end or the water outlet end of the heat sink 21, and is electrically connected with the cooling water passage 23 through the heat sink 21. Therefore, the electric connection due to the connection line 3 is unnecessary in the variation. Herein, the entire heat sink 21 is made of a conductive material. Constructions other than the above structure are identical to the structures of the unit U shown in FIG. 3.

Thus, since the connecting pipe 32 has a potential equal to the cooling water passage 23 through the heat sink 21, the connection line or the like for the electric connection between the connecting pipe 32 and the cooling water passage can be made unnecessary according to the third variation.

The semiconductor light emitting device according to the present invention and the plant cultivation apparatus using the same are not limited to the embodiment described above, and various modifications within the scope of the present invention are possible. For instance, the conductive members of the water inlet side and the water outlet side may be made of a material such as stainless steel on which rust is not easily precipitated. In this case, the generation of rust is reduced in the conductive member.

INDUSTRIAL APPLICABILITY

As described above, the semiconductor device and the plant cultivation apparatus according to the present invention can inhibit rusting in the cooling water passage, and thereby the semiconductor light emitting device and the plant cultivation apparatus using the same can prevent a clogged piping in the cooling water passage. That is, since the conductive member provided separately in the upstream direction or in the downstream direction of the water conveyance pipe has a potential equal to the conductive portion of the cooling water passage according to the present invention, the electric current hardly flows between the conductive member and the conductive portion of the cooling water passage. As a result, rusting is inhibited in the M pieces of light emitting units, and a clogged piping is prevented in the cooling water passage.

The invention claimed is:

1. A semiconductor light emitting device comprising:
    M pieces of light emitting units (M is an integer of 2 or more) in which a light emitting element array composed by arranging a plurality of semiconductor light emitting elements is mounted in a heat sink having a cooling water passage of which at least a part has conductivity;
    current supply means for electrically and serially connecting the M pieces of light emitting element arrays contained in the M pieces of light emitting units by connection lines for current supply, and which supplies electric current for making the semiconductor light emitting element emit light; and
    cooling water supply means for connecting the cooling water passages of the M pieces of heat sinks contained in the M pieces of light emitting units in parallel by water conveyance pipes including water inlet side conveyance pipes and water outlet side conveyance pipes, and which supplies cooling water which cools the semiconductor light emitting element,
    wherein, in each of the M pieces of light emitting units, a first conductive member connected electrically with the conductive portion of the cooling water passage is provided separately in the upstream direction of the water inlet side conveyance pipe by a predetermined distance from the water inlet end of the cooling water passage, and comes into contact with cooling water, and a second conductive member connected electrically with the conductive portion of the cooling water passage is provided separately in the downstream direction of the water outlet side conveyance pipe by a predetermined distance from the water outlet end of the cooling water passage, and comes into contact with cooling water, and the first conductive member and the second conductive member have an equal potential to the conductive portion of the cooling water passage, and
    wherein, in each of the M pieces of light emitting units, a first electrode and a second electrode respectively connected to the connection lines of the current supply means are provided, and the electric current is supplied to the semiconductor light emitting element between the first electrode and the second electrode and through the conductive portion of the heat sink,
    the heat sink includes
    a first heat sink provided between the light emitting element array and the first electrode and
    a second heat sink provided between the light emitting element array and the second electrode, and
    the cooling water passage includes
    a first passage part provided in the first heat sink and placed between the light emitting element array and the first electrode, and
    a second passage part provided in the second heat sink and placed between the light emitting element array and the second electrode.

2. The semiconductor light emitting device according to claim 1,
    wherein the water conveyance pipe is made of an insulating material, and the conductive member is formed into a cylinder, and is interposed in the middle of the water conveyance pipe, and
    wherein the sectional area of the conductive portion of the cooling water passage at the water inlet end or the water outlet end of the heat sink is smaller than that of the conductive member formed into the cylinder.

3. The semiconductor light emitting device according to claim 1, wherein the heat sink is made of a conductive material, and the conductive member is fitted to the water inlet end or the water outlet end of the heat sink, and
    wherein the conductive member is formed substantially like a funnel so as to extend its diameter toward the upstream direction or the downstream direction of the water conveyance pipe.

4. The semiconductor light emitting device according to claim 1, wherein the semiconductor light emitting element is a semiconductor laser element.

5. A plant cultivation apparatus comprising the semiconductor light emitting device according to claim 1, wherein the semiconductor light emitting device irradiates plants with light to cultivate the plants.

* * * * *